(12) United States Patent
Chiu et al.

(10) Patent No.: US 7,931,146 B2
(45) Date of Patent: Apr. 26, 2011

(54) PHOTOMASK CASE STRUCTURE

(75) Inventors: Ming-Chien Chiu, Shulin (TW);
Chang-Cheng Chen, Shulin (TW);
Kun-Hao Cheng, Shulin (TW)

(73) Assignee: Gudeng Precision Industrial Co., Ltd., Shulin (TW)

( * ) Notice: Subject to any disclaimer, the term of this patent is extended or adjusted under 35 U.S.C. 154(b) by 60 days.

(21) Appl. No.: 12/468,531

(22) Filed: May 19, 2009

(65) Prior Publication Data
US 2010/0294688 A1 Nov. 25, 2010

(51) Int. Cl.
*B65D 85/48* (2006.01)
(52) U.S. Cl. ........................................ 206/454; 206/710
(58) Field of Classification Search .......... 206/454–456, 206/480, 482, 483, 706, 710, 832; 211/41.14, 211/41.17, 41.18; 118/500; 355/72, 75; 414/217.1, 940
See application file for complete search history.

(56) References Cited

U.S. PATENT DOCUMENTS

| 6,216,873 B1 * | 4/2001 | Fosnight et al. | 206/710 |
|---|---|---|---|
| 7,088,430 B2 * | 8/2006 | Chiu | 355/75 |
| 7,581,639 B2 * | 9/2009 | Chiu | 206/454 |
| 2010/0126904 A1 * | 5/2010 | Cheng et al. | 206/710 |

* cited by examiner

*Primary Examiner* — Luan K Bui
(74) *Attorney, Agent, or Firm* — Leong C. Lei

(57) ABSTRACT

The present invention relates to a photomask case structure, and more particularly to a photomask case able to firmly fix position of a photomask, which includes an upper cover, a lower cover, supporters and position fixing pieces. Accordingly, when a photomask is retained within the photomask case, then elastic holding portions of the position fixing pieces are used to elastically hold one side of the photomask, beveled edges of the position fixing pieces are used to hold another side of the photomask, and finally press portions of the elastic holding portions are used to elastically press down on the surface of the photomask, thereby firmly retaining the photomask within the photomask case, and preventing impact damage to the photomask from occurring.

12 Claims, 6 Drawing Sheets

PHOTOMASK CASE STRUCTURE

BACKGROUND OF THE INVENTION (a) Field of the Invention

The present invention provides a photomask case, and more particularly provides a photomask case structure able to firmly fix position of a photomask.

(b) Description of the Prior Art

A "wafer" is the most important material for manufacturing semiconductors, and the primary raw material for manufacturing wafers is silicon dioxide. A piece of wafer undergoes several hundred processing programs, including deposition, etching, heating, photoresist processing, coating, developing, and so on, whereby dozens, even several hundreds of microcircuit semiconductors can be manufactured from one piece of wafer depending on its size. Moreover, in order to manufacture wafers provided with different electric circuits and electronic components, preplanning of the photomask must be implemented.

The photomask can be said to be the mold for manufacturing the wafer. When a microcircuit company plans out a circuit design drawing for a chip, then the circuit design drawing must be sent to the photomask manufacturing company to implement manufacture of the photomask. The photomask manufacturing company is then able to design and plan out the corresponding photomask based on the circuit design drawing. The more complex and precise the circuit design, the more photomask layers required.

Furthermore, in order to use the photomask to plan and design the circuit design on the wafer, then the application of optical micro-imaging technology is necessary. Optical micro-imaging technology uses the exposure principle, whereby, a specific pattern can be exposed and revealed when light is transmitted through the photomask and projected onto the wafer.

However, the following problems and shortcomings are still in need of improvement when using the aforementioned photomask:

Because any tiny dust particles attached to the photomask will result in poor quality in the projected image, thus, cleanness is extremely important when used to produce developed image photomasks.

SUMMARY OF THE INVENTION

A primary objective of the present invention lies in providing a structure for a photomask case able to firmly fix the position of a photomask, and thereby prevent impact damage to the photomask.

A second objective of the present invention lies in providing a structure for a photomask case which enables providing a minimum necessary supporting area between a photomask and the photomask case, thereby reducing friction between the photomask and the photomask case, and further decreasing production of dust particles.

Another objective of the present invention lies in providing a structure for a photomask case which is able to elastically hold a photomask, thereby preventing the photomask from being damaged from excessive pressing.

In order to achieve the aforementioned objectives, the present invention comprises an upper cover, a lower cover, at least one supporter and at least one position fixing piece, wherein the upper cover and the lower cover can be assembled to form a single body, and the inner space formed from the assembly enables retaining a photomask therein. The supporters are fixedly disposed on the lower cover, and a supporting piece able to support a photomask is formed on the top end of each of the supporters. The position fixing pieces are fixedly disposed on the upper cover, and an elastic holding portion, able to elastically hold the sides of the photomask, curvingly extends from each of the position fixing pieces, and the elastic holding portion further upwardly extends and then curves downward to form a press portion able to elastically press down and fix the photomask. Moreover, a beveled edge able to hold another side of the photomask extends from each of the position fixing pieces.

Because of the elastic holding portion curvingly extending from each of the position fixing pieces and able to elastically hold the sides of the photomask, the press portion upwardly extending and then curving downward from each of the elastic holding portions and able to elastically press down and fix the photomask, in addition to the beveled edge extending from each of the position fixing pieces and able to hold another side of the photomask, thus, when a photomask is retained within the photomask case, then the elastic holding portions and the beveled edges can be used to effectively fix the position of the photomask. Moreover, when assembling the upper cover to the lower cover, then press portions are able to press downward and press fit the photomask, thereby achieving the effectiveness to firmly fix the position of the photomask.

In addition, because of the supporting pieces able to support a photomask located on the top ends of the supporters, thus, when a photomask is retained within the photomask case, then the supporting pieces are used to support the photomask. According to such a structure, the chance of friction occurring between the photomask and the photomask case is effectively reduced, and further decreases production of dust particles.

Furthermore, because the elastic holding portion able to elastically hold the sides of the photomask curvingly extending from each of the position fixing pieces of the present invention and the press portion able to elastically press down and fix the photomask upwardly extending and then curving downward from each of the elastic holding portions are configured to provide a curved elastic structure, thus, when a photomask is retained within the photomask case, then the curved structure can be effectively used to provide an elastic cushioning effect, and further prevent damage to the photomask from excessive pressing.

To enable a further understanding of said objectives and the technological methods of the invention herein, a brief description of the drawings is provided below followed by a detailed description of the preferred embodiments.

DETAILED DESCRIPTION OF THE PREFERRED EMBODIMENTS

Figure 1:
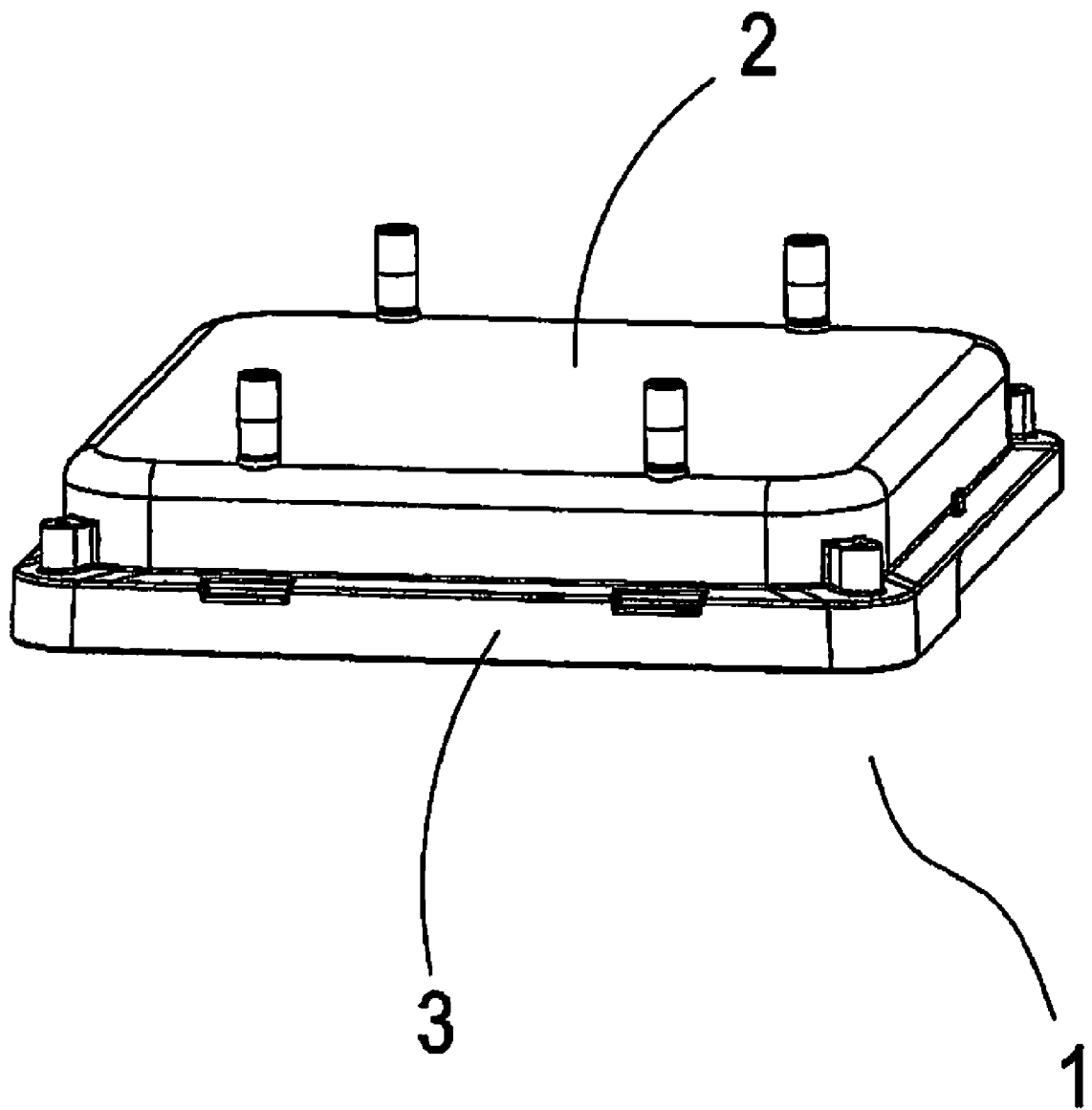
FIG. 1 is an elevational view of the preferred embodiment of the present invention.
Figure 2:
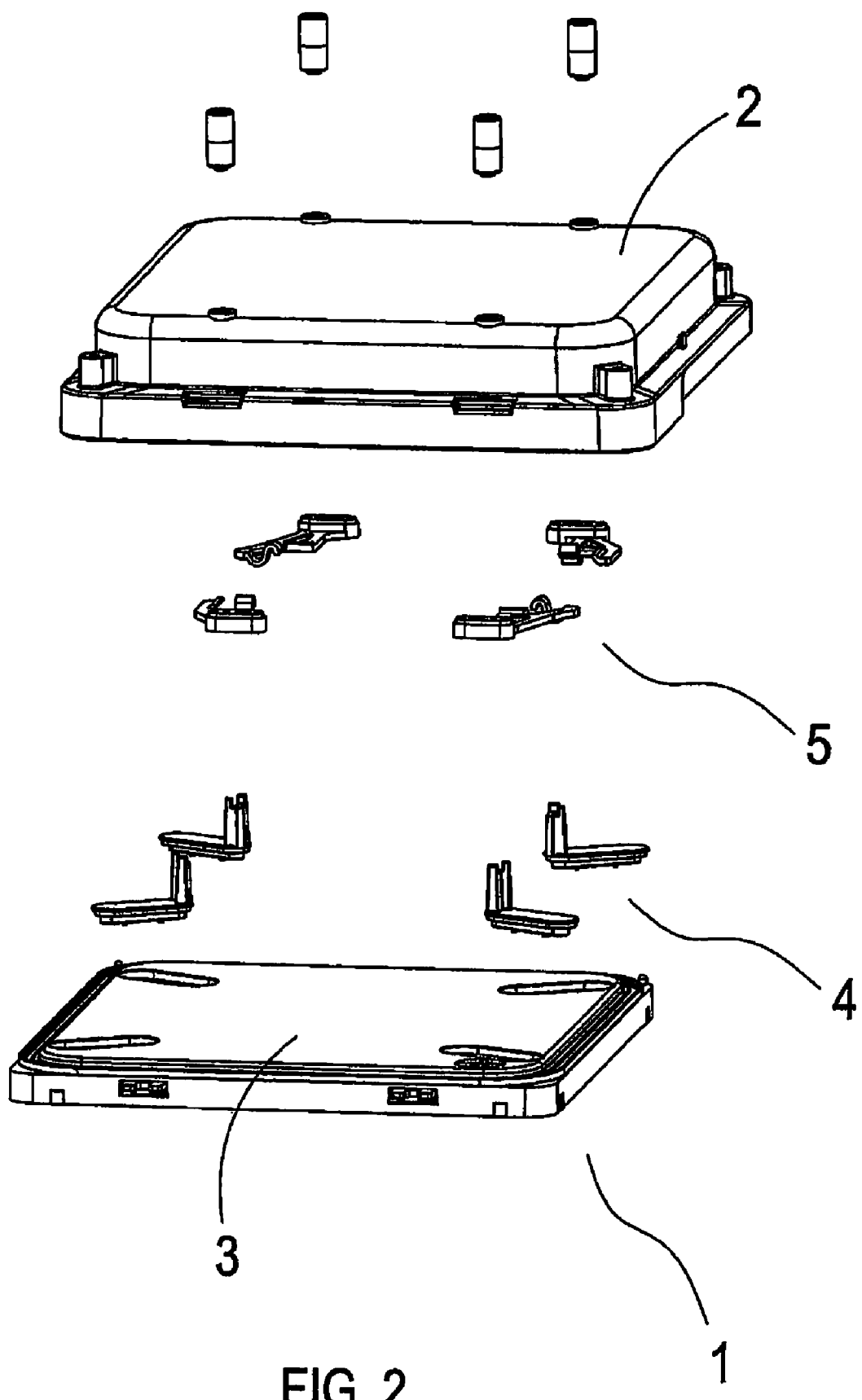
FIG. 2 is an exploded elevational view of the preferred embodiment of the present invention.
Figure 3:
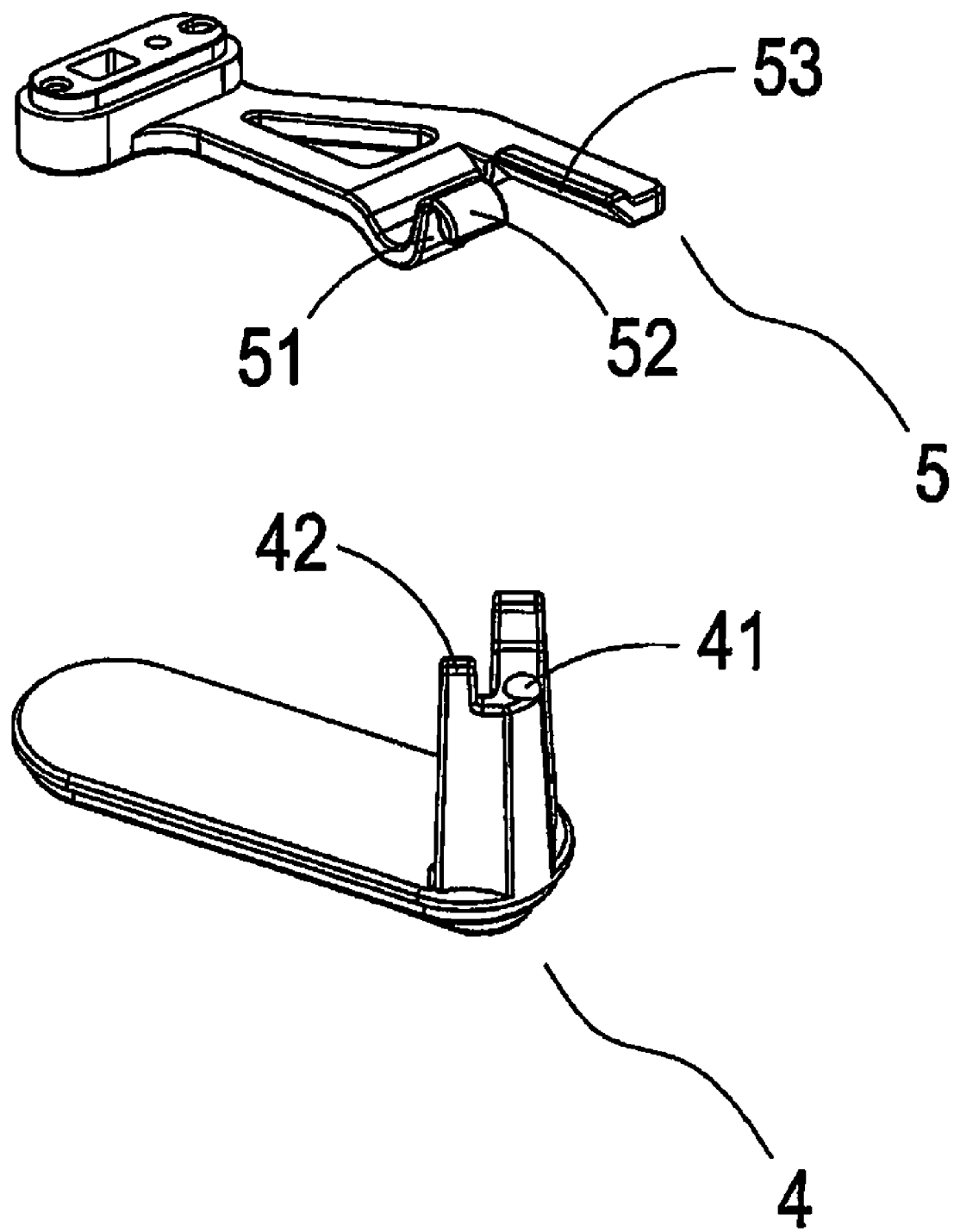
FIG. 3 is a partial schematic view of the preferred embodiment of the present invention.
Figure 4:
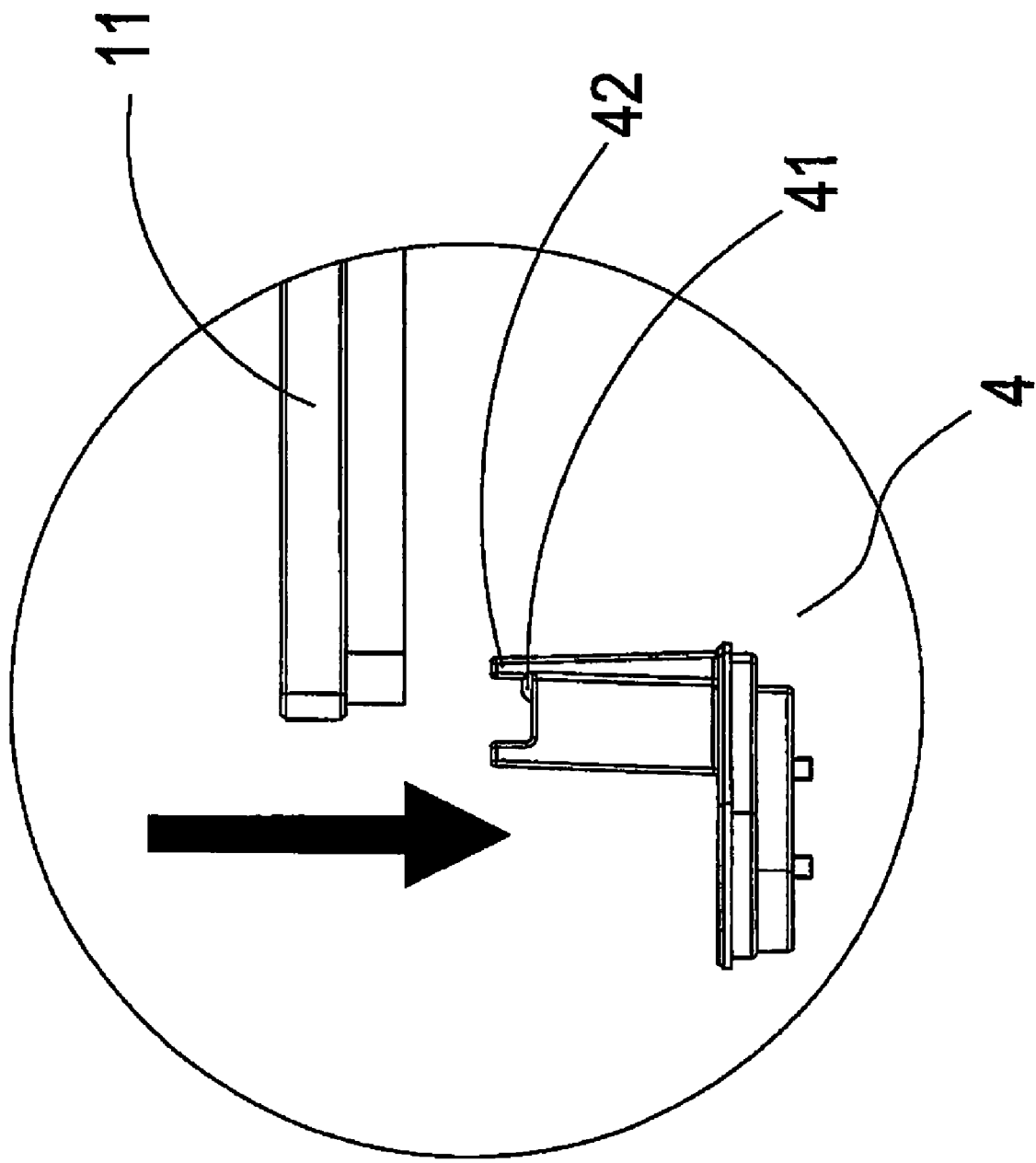
FIG. 4 is a first implementation schematic view of the preferred embodiment of the present invention, depicting support of a photomask using supporting pieces.
Figure 5:
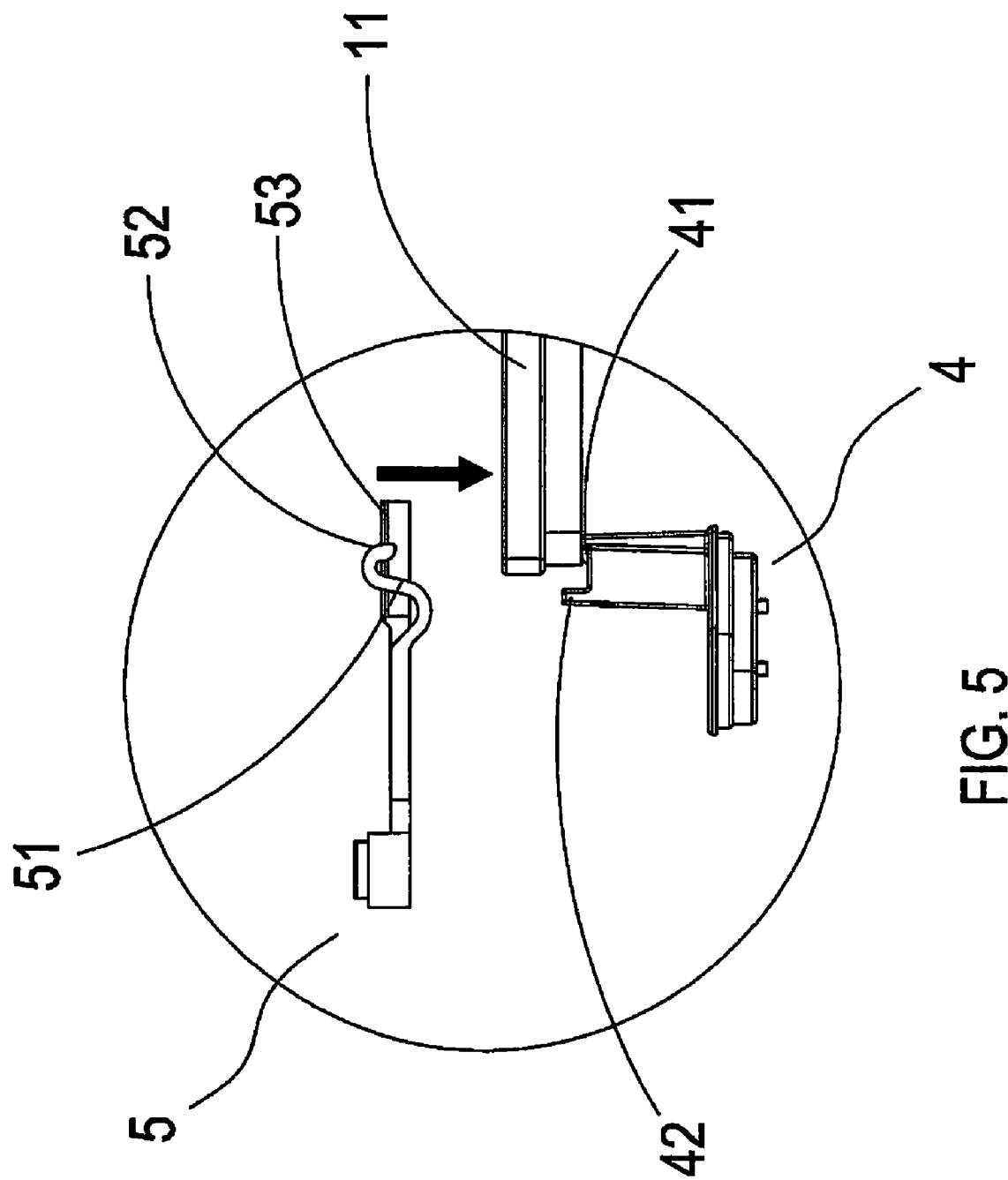
FIG. 5 is a second implementation schematic view of the preferred embodiment of the present invention, depicting support of a photomask using the supporting pieces and position fixing pieces making downward contact with the photomask.
Figure 6:
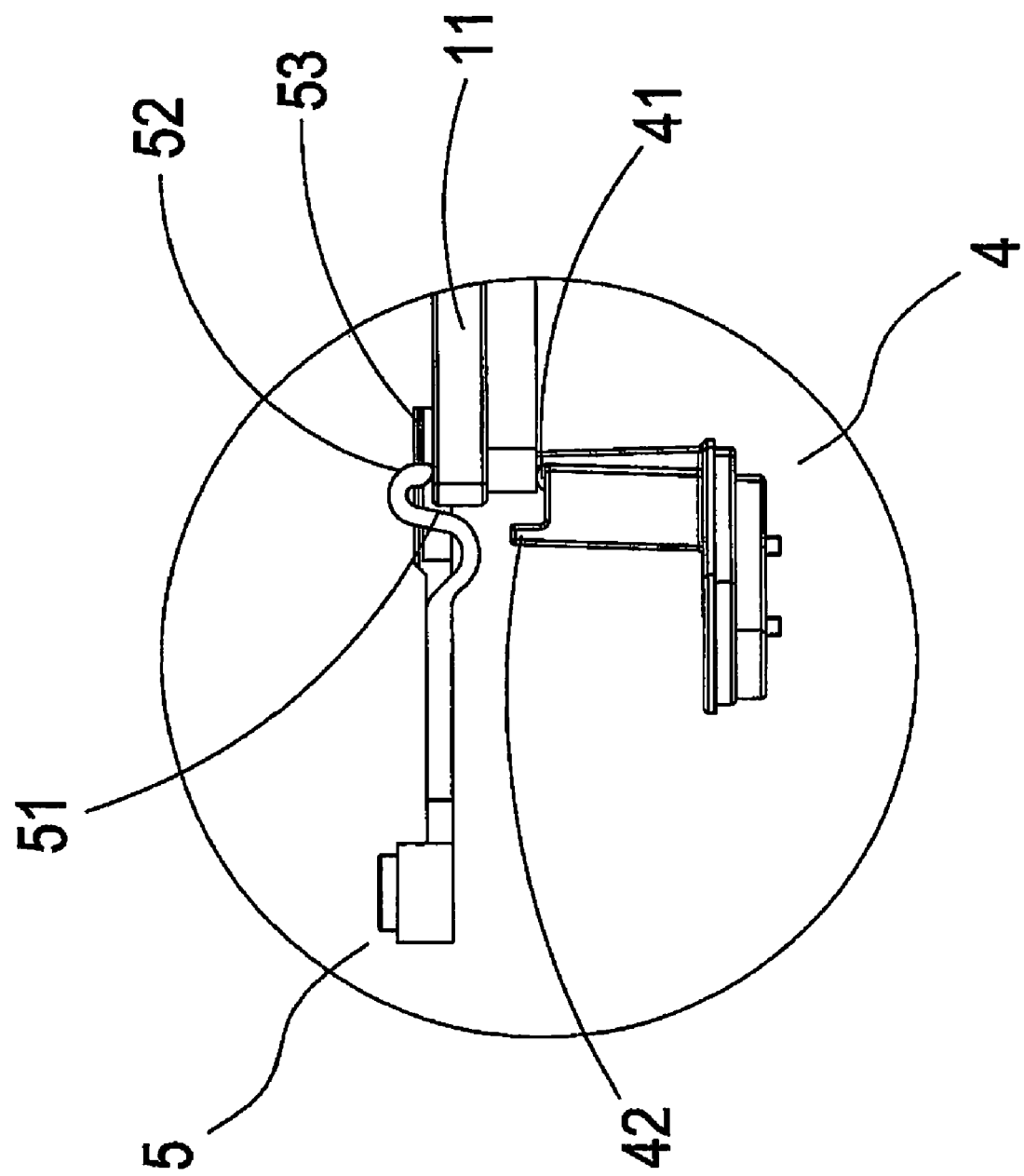
FIG. 6 is a third implementation schematic view of the preferred embodiment of the present invention, depicting the supporting pieces, the position fixing pieces and the photomask mutually press fitted within a photomask case.

Referring to FIG. 1, FIG. 2 and FIG. 3, which show an elevational view, an exploded elevational view and a partial schematic view respectively of a preferred embodiment of the present invention, and it can be clearly seen from the drawings that a photomask case 1 of the present invention comprises an upper cover 2, a lower cover 3, four supporters 4 and four position fixing pieces 5.

The lower cover 3 enables mutual assembly with the upper cover 2 to form a single body, and an inner space formed by the assembly enables retaining a photomask therein.

The supporters 4 are fixedly disposed on the lower cover 3, and the supporters 4 and the lower cover 3 may be formed as an integral body, or the supporters 4 can be joined to the lower cover 3 by fixed locking means. If a fixed locking means is used, then photomasks of other sizes can commonly use the photomask case 1, only requiring replacement of the structural type of the supporters 4 (a fixed locking means is used in the embodiment). A supporting piece 41 able to support a photomask is formed on the top end of each of the supporters 4, and the supporting pieces 41 can be point-like protrusions. The supporting pieces 41 are able to support four corners of the photomask. At least one position limiting member 42 is formed by extending from the top end of each of the supporters 4, and the position limiting members 42 enable limiting the position of the photomask.

The position fixing pieces 5 are fixedly disposed on the upper cover 2, and the position fixing pieces 5 and the upper cover 2 can be formed as an integral body, or the position fixing pieces 5 can be joined to the upper cover 2 by fixed locking means. If a fixed locking means is used, then photomasks of other sizes can commonly use the photomask case 1, only requiring replacement of the structural type of the position fixing pieces 5 (a fixed locking means is used in the embodiment). An elastic holding portion 51, able to elastically hold the sides of the photomask, curvingly extends from each of the position fixing pieces 5, and the elastic holding portion 51 further upwardly extends and then curves downward to form a press portion 52 able to elastically press down and fix the photomask. Moreover, a beveled edge 53 able to hold another side of the photomask extends from each of the position fixing pieces 5, and inclination angle of the beveled edge 53 is between 40 degrees.about.140 degrees.

Furthermore, the photomask case 1 of the present invention can be a photomask storage case or a photomask transporting case. The supporters 4 and the position fixing pieces 5 can be formed from the same or different material. The supporters 4 and the position fixing pieces 5 can be formed from high polymer material. Moreover, the supporters 4 and the position fixing pieces 5 can be formed from electrostatic dissipation material.

According to the aforementioned structure and constructional design, circumstances during implementation of the present invention are described hereinafter. Referring together to FIG. 2, FIG. 3, FIG. 4, FIG. 5 and FIG. 6, which show the exploded elevational view, the partial schematic view, and implementation schematic views one, two and three respectively of the preferred embodiment according to the present invention, and it can be clearly seen from the drawings that when a photomask 11 is placed on the photomask case 1 of the present invention, then the supporting pieces 41 at the top ends of the four supporters 4 are used to support the photomask 11, and the supporting pieces 41 can be configured as point-like protrusions to reduce the contact area thereof. Because only the four supporting pieces 41 are used to enable supporting the photomask 11, thus, using such a structure, the minimum and necessary supporting area is provided to effectively reduce friction between the photomask 11 and the photomask case 1, and which further decreases production of dust particles.

Moreover, the at least one position limiting member 42 (the drawings depict two) extending from the top end of each of the supporters 4 enables limiting the position of the photomask 11, thereby enabling the photomask 11 to be positioned at an appropriate position.

Furthermore, when the upper cover 2 and the lower cover 3 are assembled to form a single body, because of the elastic holding portion 51 curvingly extending from each of the position fixing pieces 5, the press portion 52 upwardly extending and then curving downward from each of the elastic holding portions 51, and the beveled edge 53 extending from each of the position fixing pieces 5, then the aforementioned configuration enables the present invention to use the elastic holding portions 51 to elastically hold the sides of the photomask 11. Moreover, the beveled edges 53 are used to hold other sides of the photomask 11, and then the press portions 52 are used to elastically press down and secure the surface of the photomask 11, thereby effectively firmly fixing position of the photomask 11 within the photomask case 1 and preventing impact damage to the photomask 11.

In addition, because the elastic holding portions 51 and the press portions 52 of the present invention are configured to provide a curved elastic structure, thus, when the photomask 11 is retained within the photomask case 1, then the curved structure can be effectively used to provide an elastic cushioning effect, and further prevent damage to the photomask 11 from excessive pressing.

Hence, the key factors that enable the photomask case structure of the present invention to improve on the prior art are described as follows:

1. The elastic holding portions 51, able to elastically hold the sides of the photomask 11, curvingly extend from the position fixing pieces 5 of the present invention, the press portion 52 upwardly extends and then curves downward from each of the elastic holding portions 51, and the beveled edge 53 able to hold other sides of the photomask 11 extends from each of the position fixing pieces 5. Accordingly, the present invention is able to firmly fix position of the photomask 11 within the photomask case 1, thereby preventing impact damage to the photomask 11.

2. The supporting pieces 41 able to support the photomask 11 are formed at the top ends of the supporters 4 of the present invention, and at least one position limiting member 42 is formed at the top end of each of the supporters 4. When the photomask 11 is retained within the photomask case 1, then the supporting pieces 41 are used to support the photomask 11, and the position limiting members 42 are used to locate the photomask 11 at an appropriate position. Because the present invention only uses the supporting pieces 41 to support the photomask 11, thus, it effectively reduces the contact area between the photomask 11 and the photomask case 1, thereby decreasing friction between the photomask 11 and the photomask case 1, and further reducing production of dust particles.

3. The elastic holding portions 51 and the press portions 52 of the present invention are configured to provide a curved elastic structure, thus, when the photomask 11 is retained within the photomask case 1, then the curved structure can be used to effect an elastic cushioning effect, and further prevent damage to the photomask 11 from excessive pressing.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A photomask case structure comprising:
   an upper cover;
   a lower cover mutually assembled to said upper cover;
   four supporters fixedly disposed on said lower cover, said supporters being provided with four supporting pieces for supporting four corners of a photomask, each of said supporters having a top end provided with a limiting member for limiting position of said photomask; and
   four position fixing pieces fixedly disposed on said upper cover, each of said position fixing pieces having an elastic holding portion and a beveled edge, said elastic holding portion extending curvingly outwardly from each of said position fixing pieces and then extends upwardly and downwardly to form a press portion for elastically pressing down said photomask, said beveled edge extending from each of said same position fixing pieces to hold a side of said photomask thereby fixing position of said photomask.

2. The photomask structure as claimed in claim 1, wherein said supporting pieces are point-like protrusions.

3. The photomask structure as claimed in claim 1, wherein said supporters and said position fixing pieces are formed from same material.

4. The photomask structure as claimed in claim 1, wherein said supporters and said position fixing pieces are formed from different material.

5. The photomask structure as claimed in claim 1, wherein said supporters and said position fixing pieces are formed from high polymer material.

6. The photomask structure as claimed in claim 1, wherein said supporters and said position fixing pieces are formed from electrostatic dissipation material.

7. The photomask structure as claimed in claim 1, wherein said supporters and said lower cover are formed as an integral body.

8. The photomask structure as claimed in claim 1, wherein said position fixing pieces and said upper cover are formed as an integral body.

9. The photomask structure as claimed in claim 1, wherein said supporters are joined to said lower cover by fixing locking means.

10. The photomask structure as claimed in claim 1, wherein said photomask case is a photomask storage case or a photomask transporting case.

11. The photomask structure as claimed in claim 1, wherein said position fixing pieces are joined to said upper cover by fixing locking means.

12. The photomask structure as claimed in claim 1, wherein inclination angle of said beveled edge is between 40 degrees to 140 degrees.

* * * * *